(12) United States Patent
Vercesi et al.

(10) Patent No.: US 11,969,757 B2
(45) Date of Patent: Apr. 30, 2024

(54) PIEZOELECTRIC MICROMACHINED ULTRASONIC TRANSDUCER

(71) Applicant: STMicroelectronics S.r.l., Agrate Brianza (IT)

(72) Inventors: Federico Vercesi, Milan (IT); Alessandro Danei, Seveso (IT); Giorgio Allegato, Monza (IT); Gabriele Gattere, Castronno (IT); Roberto Campedelli, Novate Milanese (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 300 days.

(21) Appl. No.: 17/191,475

(22) Filed: Mar. 3, 2021

(65) Prior Publication Data

US 2021/0276044 A1 Sep. 9, 2021

(30) Foreign Application Priority Data

Mar. 6, 2020 (IT) .......................... 102020000004777

(51) Int. Cl.
*B06B 1/06* (2006.01)
*H10N 30/01* (2023.01)

(52) U.S. Cl.
CPC ........... *B06B 1/0666* (2013.01); *H10N 30/01* (2023.02)

(58) Field of Classification Search
CPC ................................ B06B 1/0666; B06B 1/06
See application file for complete search history.

(56) References Cited

U.S. PATENT DOCUMENTS

| 6,913,941 | B2 | 7/2005 | O'Brien et al. | |
|---|---|---|---|---|
| 2004/0048410 | A1 | 3/2004 | O'Brien et al. | |
| 2010/0327702 | A1* | 12/2010 | Martin | G10K 9/18 |
| | | | | 29/25.35 |
| 2015/0165479 | A1 | 6/2015 | Lasiter et al. | |
| 2018/0277737 | A1* | 9/2018 | Ohashi | A61B 8/085 |
| 2020/0194658 | A1* | 6/2020 | Guedes | H10N 30/50 |

FOREIGN PATENT DOCUMENTS

| CN | 1606476 A | 4/2005 |
|---|---|---|
| CN | 104078452 A | 10/2014 |
| CN | 106536067 A | 3/2017 |

(Continued)

*Primary Examiner* — Derek J Rosenau
(74) *Attorney, Agent, or Firm* — Seed IP Law Group LLP

(57) ABSTRACT

A method for manufacturing a PMUT device including a piezoelectric element located at a membrane element is provided. The method includes receiving a silicon on insulator substrate having a first silicon layer, an oxide layer, and a second silicon layer. Portions of a first surface of the second silicon layer are exposed by removing exposed side portions of the first silicon layer and corresponding portions of the oxide layer, and a central portion including the remaining portions of the first silicon layer and of the oxide layer is defined. Anchor portions for the membrane element are formed at the exposed portions of the first surface of the second silicon layer. The piezoelectric element is formed above the central portion, and the membrane element is defined by selectively removing the second layer and removing the remaining portion of the oxide from under the remaining portion of the first silicon layer.

20 Claims, 19 Drawing Sheets

(56) References Cited

FOREIGN PATENT DOCUMENTS

| | | |
|---|---|---|
| CN | 107046094 A | 8/2017 |
| CN | 108246593 A | 7/2018 |
| CN | 109414727 A | 3/2019 |
| CN | 110508474 A | 11/2019 |
| JP | 2012181050 A | 9/2012 |
| WO | 2019/099013 A1 | 5/2019 |

* cited by examiner

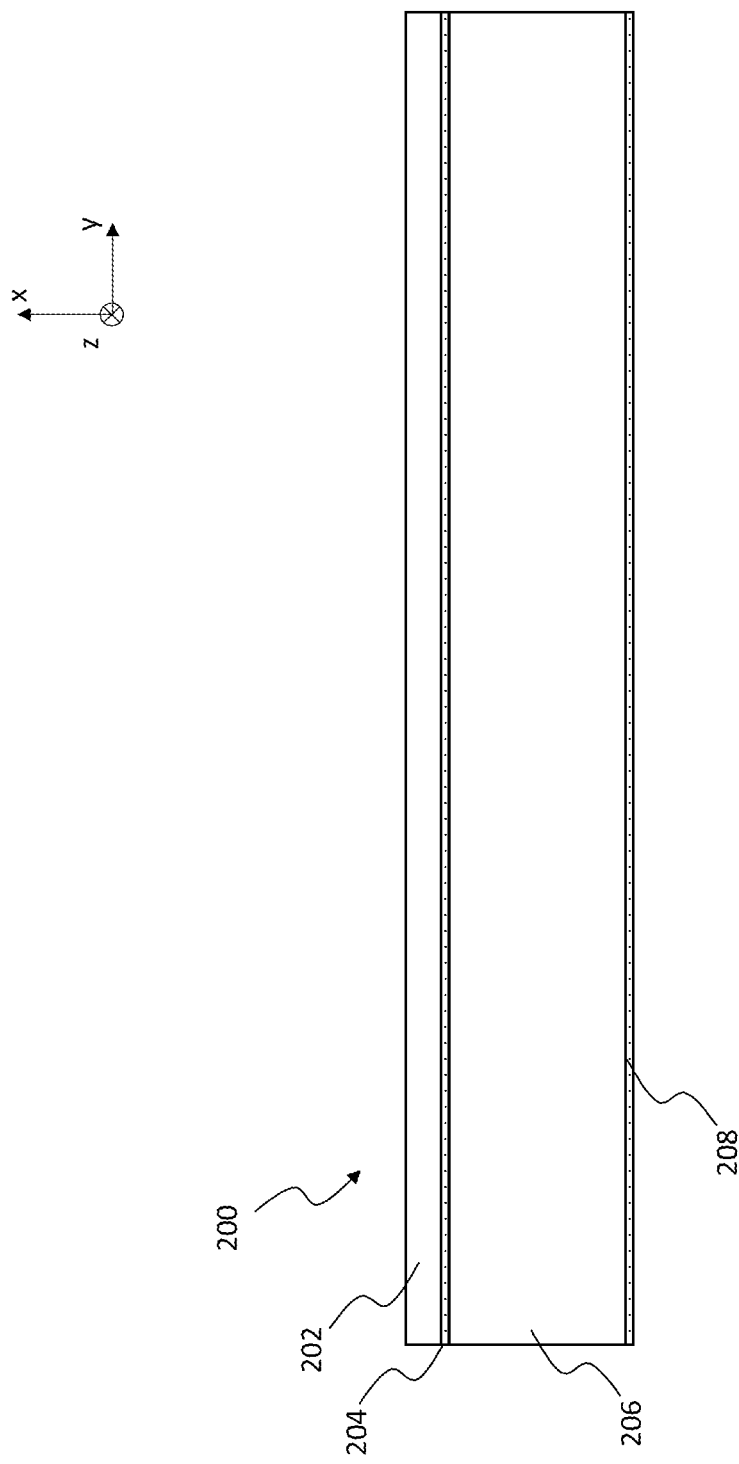

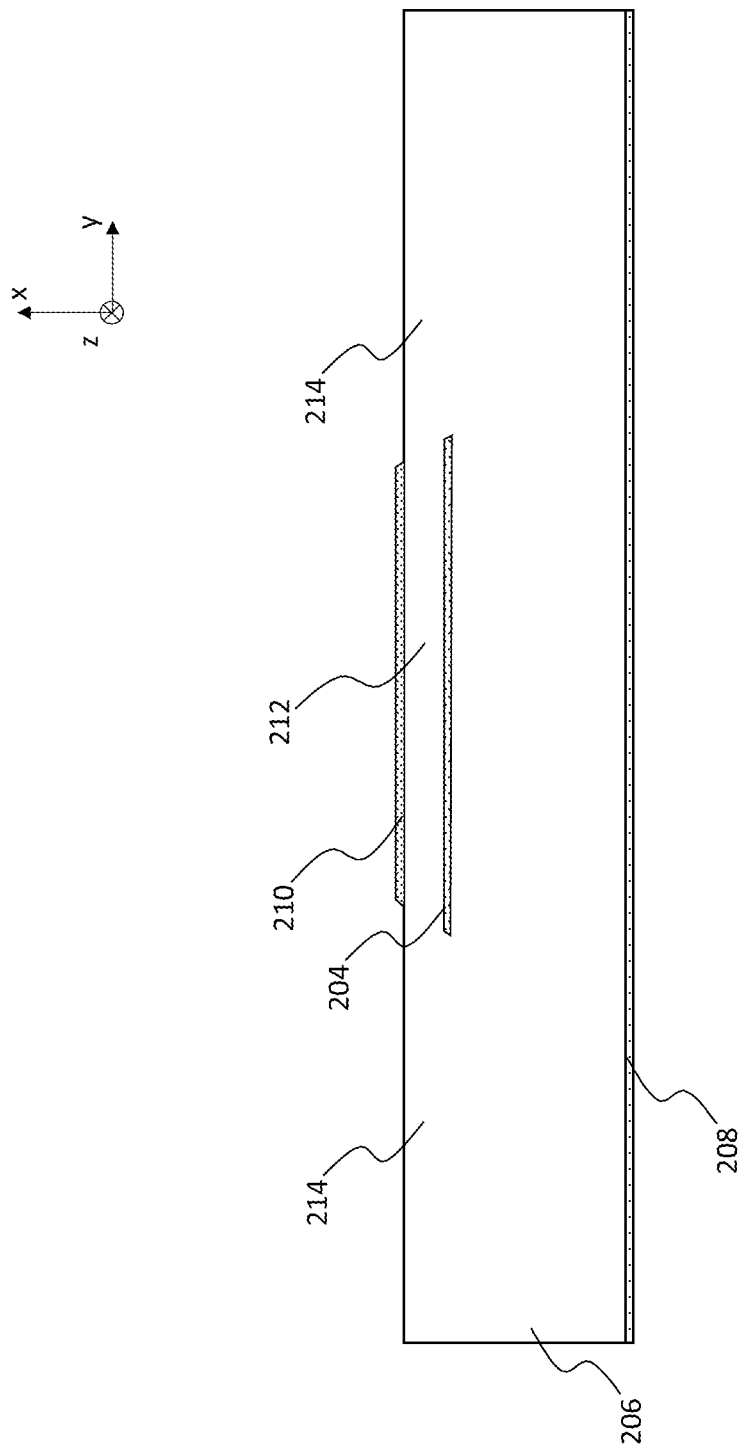

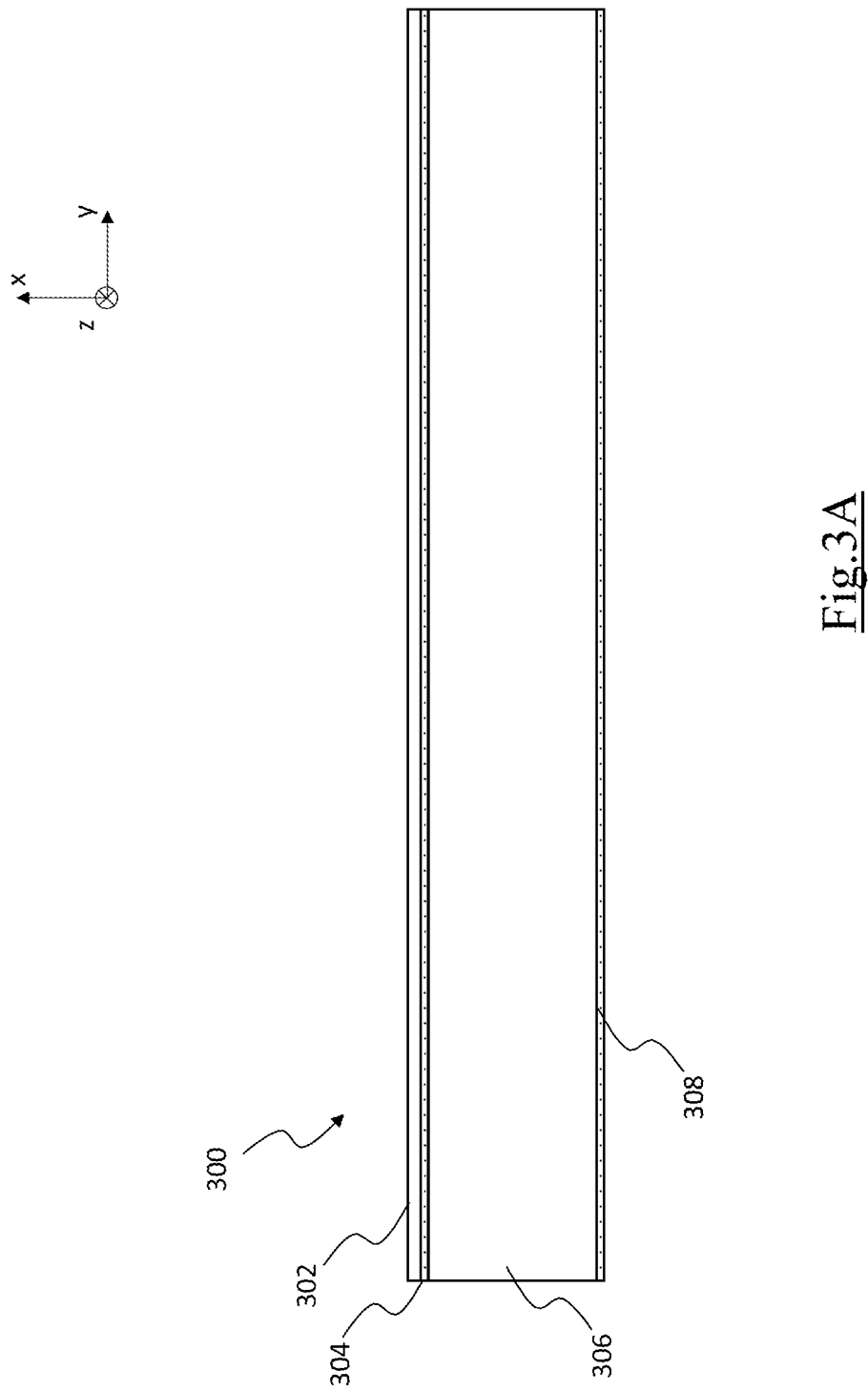

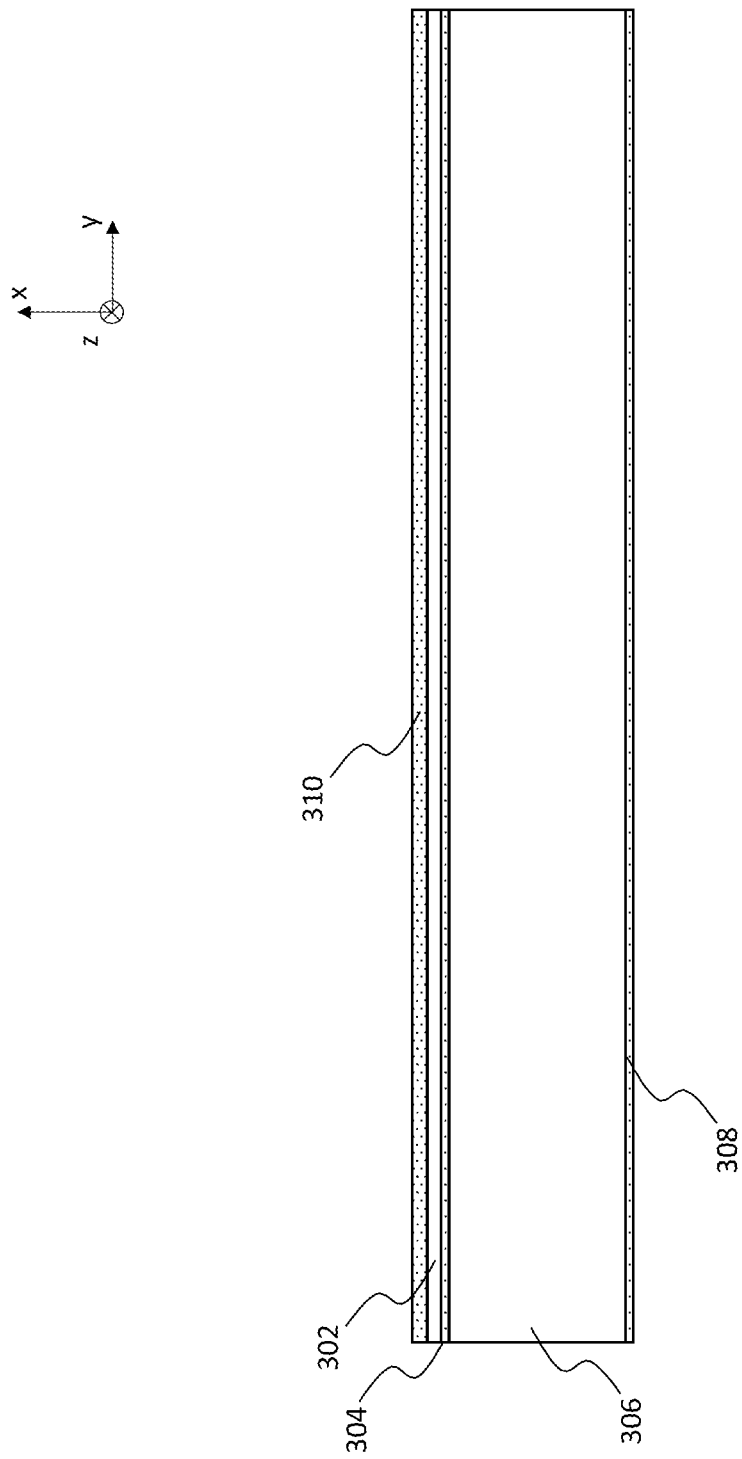

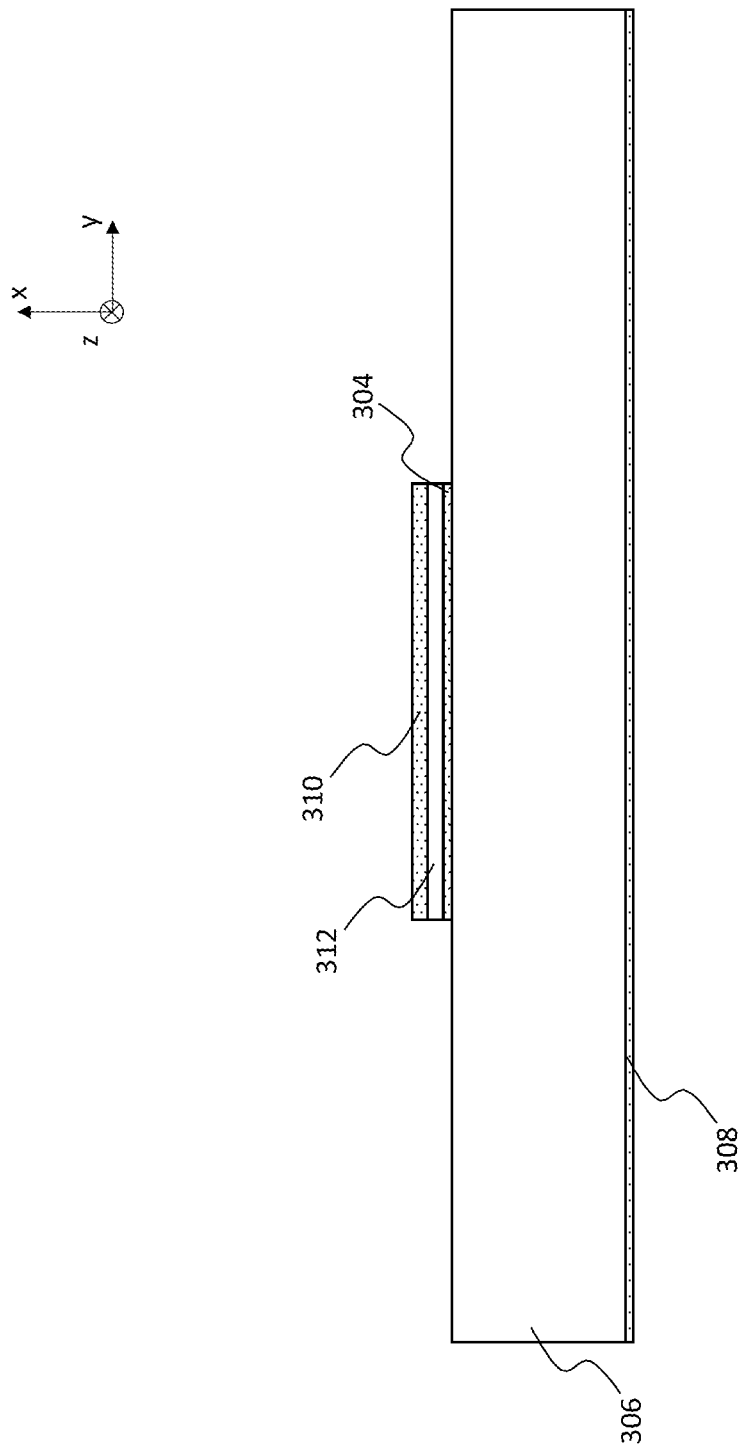

PIEZOELECTRIC MICROMACHINED ULTRASONIC TRANSDUCER

BACKGROUND

Technical Field

The present disclosure relates to the field of the Micro Electro Mechanical Systems (hereinafter referred to as "MEMS"). Particularly, the present disclosure relates to a Piezoelectric Micromachined Ultrasonic Transducer (hereinafter, referred to as "PMUT").

Description of the Related Art

A MEMS device comprises miniaturized mechanical, electrical and/or electronic components integrated in a same semiconductor material substrate, for example silicon, by means of micromachining techniques (for example, lithography, deposition, etching, deposition, growth).

A Micromachined Ultrasonic Transducer device (hereinafter referred to as "MUT device") is a kind of MEMS device adapted to transmit/receive ultrasonic waves. Among the known MUT devices, the Piezoelectric MUT devices (hereinafter referred to as "PMUT devices") are known. A PMUT device is a MUT device whose operation is based on the flexural motion of one or more thin membrane elements mechanically coupled with a thin piezoelectric element.

When the PMUT device operates as a transmitter, the membrane element flexes and oscillates about an equilibrium position under the action of the piezoelectric element when an AC electric signal is applied to the latter. The oscillations of the membrane element thus cause the generation of ultrasonic waves.

When the PMUT device operates as a receiver, ultrasonic waves hitting the membrane element cause the membrane to oscillate about its equilibrium position. The oscillations of the membrane element act on the piezoelectric element, which accordingly generates a corresponding AC electric signal.

During the generation and the reception of ultrasonic waves (i.e., both in the case in which the PMUT device operates as a transmitter and in the case in which the PMUT device operates as a receiver), the membrane element oscillates about its equilibrium position at a corresponding resonance frequency.

In order to be free to oscillate about its equilibrium position, the membrane element(s) is/are suspended (e.g., cantilevered) with respect to the semiconductor substrate of the PMUT device.

For this purpose, during the manufacturing of a PMUT device, it is known to form anchor portions adapted to mechanically connect the membrane element(s) of the PMUT device to its semiconductor substrate.

The resonance frequency of a PMUT device is defined, at the design stage, based on parameters such as size and materials of the membrane element. Given a specific material, the thickness of the membrane element(s) is one among the most important parameters defining the resonance frequency.

U.S. Pat. No. 6,913,941 discloses a method for creating a MEMS structure. According to said method, a substrate is provided having a sacrificial layer disposed thereon and having a layer of silicon disposed over the sacrificial layer. A first trench is created which extends through the silica layer and the sacrificial layer and which separates the sacrificial layer into a first region enclosed by the first trench and a second region exterior to the first trench. A first material is deposited into the first trench such that the first material fills the first trench to a depth at least equal to the thickness of the sacrificial layer. A second trench is created exterior to the first trench which extends through at least the silicon layer and exposes at least a portion of the second region of the sacrificial layer. The second region of the sacrificial layer is contacted, by way of the second trench, with a chemical etching solution adapted to etch the sacrificial layer, said etching solution being selective to the first material.

BRIEF SUMMARY

The Applicant has found that the known solutions for manufacturing MEMS devices, such as PMUT devices, are not particularly efficient.

PMUT devices manufactured according to the known solutions are negatively affected by a reduced precision in the control of the membrane thickness. Using known manufacturing methods, the thickness of the membrane cannot be controlled with a sufficient precision, causing a not negligible spread of the resonance frequency among the PMUT devices obtained from a same wafer of semiconductor material.

In view of the above, the Applicant has devised a solution for improving the process for manufacturing a PMUT device.

An aspect of the present disclosure relates to a method for manufacturing a PMUT device comprising a piezoelectric element located at a membrane element. The method comprises providing a silicon on insulator substrate comprising a first silicon layer, an oxide layer, and a second silicon layer.

According to an embodiment of the present disclosure, the first silicon layer is stacked on the oxide layer along a first direction, and the oxide layer is stacked on the second silicon layer along said first direction.

According to an embodiment of the present disclosure, the method further comprises removing exposed side portions of said first silicon layer and corresponding portions of the oxide layer to expose portions of a first surface of the second silicon layer previously covered by said oxide layer, and define a central portion comprising the remaining portions of the first silicon layer and of the oxide layer.

According to an embodiment of the present disclosure, the method further comprises forming anchor portions for said membrane element at the exposed portions of the first surface of the second silicon layer.

According to an embodiment of the present disclosure, the method further comprises forming said piezoelectric element above said central portion along said first direction.

According to an embodiment of the present disclosure, the method further comprises selectively removing said second layer and removing said remaining portion of the oxide from under the remaining portion of the first silicon layer to define said membrane element.

According to an embodiment of the present disclosure, said membrane element comprises the remaining portion of the first silicon layer.

According to an embodiment of the present disclosure, the thickness of the first silicon layer along the first direction corresponds to a thickness of the membrane element along the first direction.

According to an embodiment of the present disclosure, the thickness of the first silicon layer along the first direction is lower than a thickness of the membrane element along the first direction.

According to an embodiment of the present disclosure, the method further comprises, before forming said piezoelectric element, growing silicon on said remaining portion of the first silicon layer until the thickness of the remaining portion of the first silicon layer reaches said thickness of the membrane element.

According to an embodiment of the present disclosure, said growing silicon on said remaining portion of the first silicon layer comprises growing silicon using an epitaxial technique.

According to an embodiment of the present disclosure, said forming the anchor portions comprises growing silicon on said exposed portions of the first surface of the second silicon layer.

According to an embodiment of the present disclosure, said growing silicon on said exposed portions of the first surface of the second silicon layer comprises growing silicon using an epitaxial technique.

According to an embodiment of the present disclosure, the method further comprises carrying out a smoothing procedure directed to obtain a substantially flat top surface made of monocrystalline silicon from the grown monocrystalline silicon, said smoothing procedure being carried out using at least one between:
- a chemical mechanical polishing technique, and
- a high temperature hydrogen annealing technique.

According to an embodiment of the present disclosure, the method further comprises, after forming said piezoelectric element and before removing said remaining portion of the oxide, selectively removing the remaining portion of the first silicon layer until reaching said remaining portion of the oxide.

According to an embodiment of the present disclosure, said first silicon layer, said second silicon layer and said anchor portions are made of monocrystalline silicon.

Another aspect of the present disclosure relates to a PMUT device.

According to an embodiment of the present disclosure, the PMUT device comprises a silicon substrate.

According to an embodiment of the present disclosure, the PMUT device comprises a membrane element adapted to generate and receive ultrasonic waves by oscillating, about an equilibrium position, at a corresponding resonance frequency.

According to an embodiment of the present disclosure, the PMUT device comprises anchor portions for fixing said membrane element to the silicon substrate.

According to an embodiment of the present disclosure, the PMUT device comprises a piezoelectric element on said membrane elements configured to:
- cause the membrane element oscillates when electric signals are applied to the piezoelectric element, and
- generate electric signals in response to oscillations of the membrane element.

According to an embodiment of the present disclosure, the membrane element and the anchor portions are made of monocrystalline silicon.

Another aspect of the present disclosure relates to an electronic system comprising at least one or more PMUT devices.

BRIEF DESCRIPTION OF THE SEVERAL VIEWS OF THE DRAWINGS

These and other features and advantages of the solution according to the present disclosure will be better understood by reading the following detailed description of an embodiment thereof, provided merely by way of non-limitative example, to be read in conjunction with the attached drawings. On this regard, it is explicitly intended that the drawings are not necessarily drawn to scale (with some details thereof that can be exaggerated and/or simplified) and that, unless otherwise stated, they are simply used for conceptually illustrating the described structures and procedures. Particularly:

FIGS. 2A-2K illustrate main steps of a method for manufacturing the PMUT device of FIG. 1 according to a first embodiment of the present disclosure;

FIGS. 3A-3F illustrate main steps of a method for manufacturing the PMUT device of FIG. 1 according to a second embodiment of the present disclosure.

DETAILED DESCRIPTION

Figure 1:
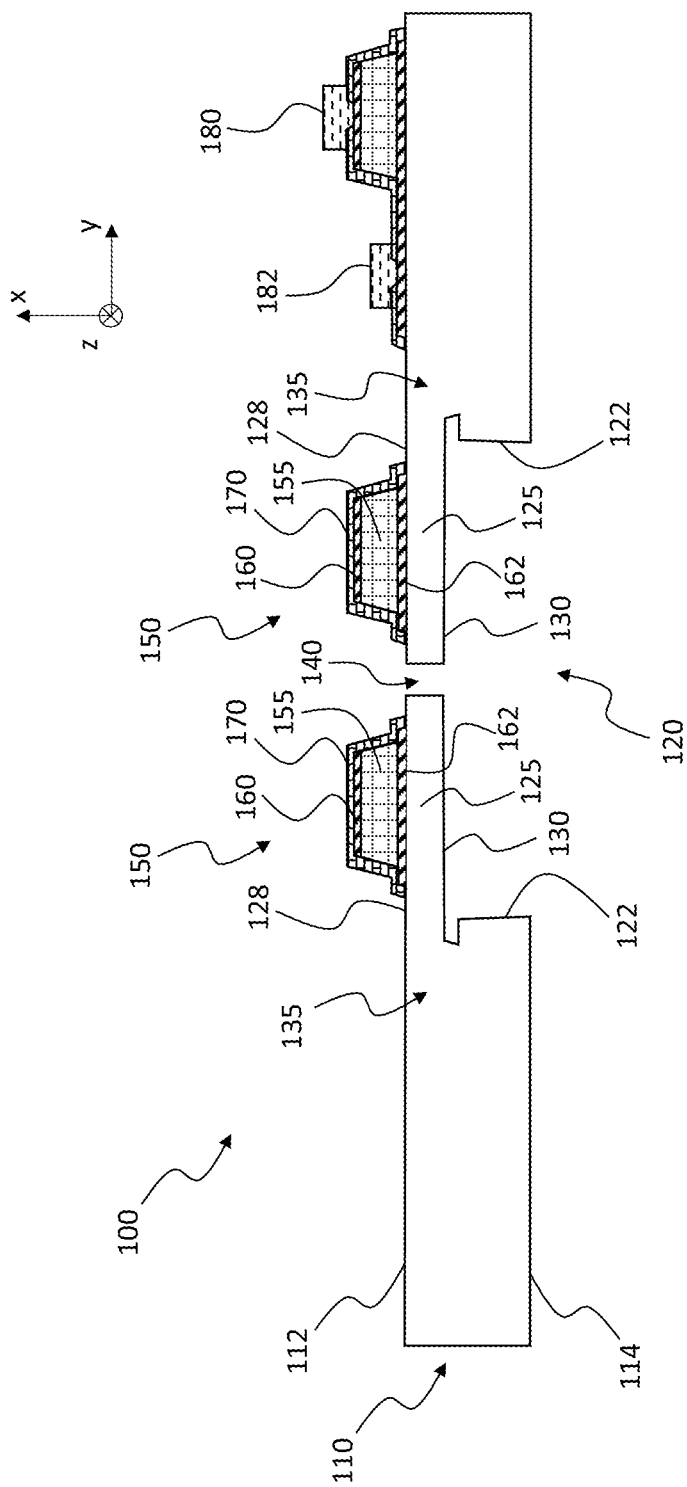
FIG. 1 schematically illustrates a cross section view of a PMUT device according to an embodiment of the present disclosure.

FIG. 1 schematically illustrates a cross section view of a PMUT device, globally identified with reference 100, according to an embodiment of the present disclosure.

In the following of the present description, direction terminology (such as for example, top, bottom, higher, lower, lateral, central longitudinal, transversal, vertical) will be only used for describing the PMUT device 100 in relation to the very specific orientation illustrated in the figures, and not for describing possible specific orientation the PMUT device 100 will have during its operation.

On this regard, a reference direction system is shown including three orthogonal directions X, Y, Z.

According to an embodiment of the present disclosure, the PMUT device 100 has a circular (or substantially circular) shape (along a plane parallel to directions Y and Z). According to other embodiments of the present disclosure, the PMUT device 100 has different shapes, such as a square (or substantially square) shape, a rectangular (or substantially rectangular) shape, a triangular (or substantially triangular) shape, hexagonal (or substantially hexagonal) shape, or an octagonal (or substantially octagonal) shape.

According to an embodiment of the present disclosure, the PMUT device 100 comprises a semiconductor substrate 110 integrating the other components of the PMUT device 100 itself. According to an embodiment of the present disclosure, the semiconductor substrate 110 is a monocrystalline silicon substrate, hereinafter simply referred to as silicon substrate 110. The silicon substrate 110 of the PMUT device 100 illustrated in FIG. 1 has a front operative surface 112 and an opposite (along direction X) back operative surface 114. The front operative surface 112 and the back operative surface 114 extend parallel to directions Y and Z.

According to an embodiment of the present disclosure, the silicon substrate 110 comprises a recess 120 extending from the back operative surface 114 toward the front operative surface 112 along the direction X (but without reaching the front operative surface 112).

According to an embodiment of the present disclosure, the recess 120 defines in the silicon substrate 110 a hollow space delimited by lateral walls 122 extending substantially along the direction X. Similar considerations apply in case the lateral walls 122 are slanted with respect to the direction X.

According to an embodiment of the present disclosure, the PMUT device 100 comprises a membrane element 125 adapted to generate and receive ultrasonic waves by oscillating, about an equilibrium position, at a corresponding resonance frequency. According to an embodiment of the present disclosure, the membrane element 125 has a top surface 128 and a bottom surface 130, extending along a plane parallel to directions Y and Z.

According to an embodiment of the present disclosure, the membrane element 125 has a circular (or substantially circular) shape (along a plane parallel to directions Y and Z). According to other embodiments of the present disclosure, the membrane element 125 has different shapes, such as a square (or substantially square) shape, a rectangular (or substantially rectangular) shape, a triangular (or substantially triangular) shape, hexagonal (or substantially hexagonal) shape, or an octagonal (or substantially octagonal) shape.

According to an embodiment of the present disclosure, the bottom surface 130 of the membrane element 125 corresponds to a top surface of the hollow space defined by the recess 120.

According to an embodiment of the present disclosure, the top surface 128 of the membrane element 125 is flush with the front operative surface 112 of the silicon substrate 110.

According to an embodiment of the present disclosure, the membrane element 125 is made of the same material of the silicon substrate 110, i.e., silicon, particularly monocrystalline silicon.

According to an embodiment of the present disclosure, the membrane element 125 has a thickness (along the direction X) ranging from 1 to 2.5 μm, and in some embodiments, between 1.5 to 2 μm.

According to an embodiment of the present disclosure, the membrane element 125 is connected (i.e., fixed) to the silicon substrate 110 by means of anchor portions 135 made of the same material of the silicon substrate 110, i.e., silicon, particularly monocrystalline silicon. The anchor portions 135 are located in portions of the silicon substrate 110 at the intersection between the lateral walls 122 of the recess 120 and the bottom surface 130 of the membrane element 125.

According to an embodiment of the present disclosure, a vent hole 140 is provided in a central portion of the membrane element 125 for allowing air to discharge when the membrane element 125 is oscillates.

According to an embodiment of the present disclosure, the PMUT device 100 comprises a piezoelectric element 150 located on the top surface 128 of the membrane element 125. According to an embodiment of the present disclosure, the piezoelectric element 150 has a circular (or substantially circular) shape (along a plane parallel to directions Y and Z), and surrounds the vent hole 140. According to other embodiments of the present disclosure, the piezoelectric element 150 has different shapes, such as a square (or substantially square) shape, a rectangular (or substantially rectangular) shape, a triangular (or substantially triangular) shape, hexagonal (or substantially hexagonal) shape, or an octagonal (or substantially octagonal) shape.

According to an embodiment of the present disclosure, the piezoelectric element 150 comprises a layer of piezoelectric material 155, e.g., comprising aluminum nitride, between a first layer 160 and a second layer 162 made of conductive material, such as molybdenum. The first layer 160 and the second layer 162 form electrodes of the piezoelectric element 150 across which:

- electric signals can be applied for causing oscillations of the membrane element 125 (when the PMUT device 100 operates as a transmitter), and
- electric signals can be generated in response to oscillations of the membrane element 125 (when the PMUT device 100 operates as a receiver).

According to an embodiment of the present disclosure, the piezoelectric element 150 is covered with a passivation layer 170, e.g., comprising aluminum nitride.

In order to access the PMUT device 100 for applying input electric signals thereto and for reading electric signals therefrom, according to an embodiment of the present disclosure, a contact element 180 is provided to electrically contact the first layer 160 of conductive material, and a contact element 182 is provided to electrically contact the second layer 162 of conductive material. According to an embodiment of the present disclosure, the contact elements 180, 182 are made of a highly conductive material, such as gold, aluminum or aluminum-copper.

FIGS. 2A-2K illustrate main steps of a method for manufacturing the PMUT device 100 of FIG. 1 according to a first embodiment of the present disclosure.

Making reference to FIG. 2A, the manufacturing process according to this embodiment of the present disclosure starts by providing as starting substrate a Silicon-On-Insulator substrate 200 comprising layers stacked on top of each other along the direction X. Starting from the top and then proceeding along the direction X toward the bottom, the Silicon-On-Insulator substrate 200 comprises an active layer—hereinafter referred to as device layer 202—, a buried oxide layer—hereinafter referred to as box layer 204—, a support layer—hereinafter referred to as handle layer 206—and a back oxide layer 208. The device layer 202 and the handle layer 206 are made of monocrystalline silicon, while the box layer 204 and the back oxide layer 208 are made of electrically insulating silicon dioxide.

According to this embodiment of the disclosure, the thickness of the device layer 202 along the direction X is selected to correspond (for example to be substantially equal) to the desired thickness of the membrane element 125 of the PMUT device 100 (see FIG. 1), such as for example 1.5 μm.

According to an exemplary embodiment of the present disclosure, the box layer 204 has a thickness along the direction X lower than the thickness of the device layer 202, such as for example 0.5 μm.

According to an exemplary embodiment of the present disclosure, the thickness of the handle layer 206 along the direction X may range from 1000 to 400 and in some embodiments, 725 μm.

Figure 2B:
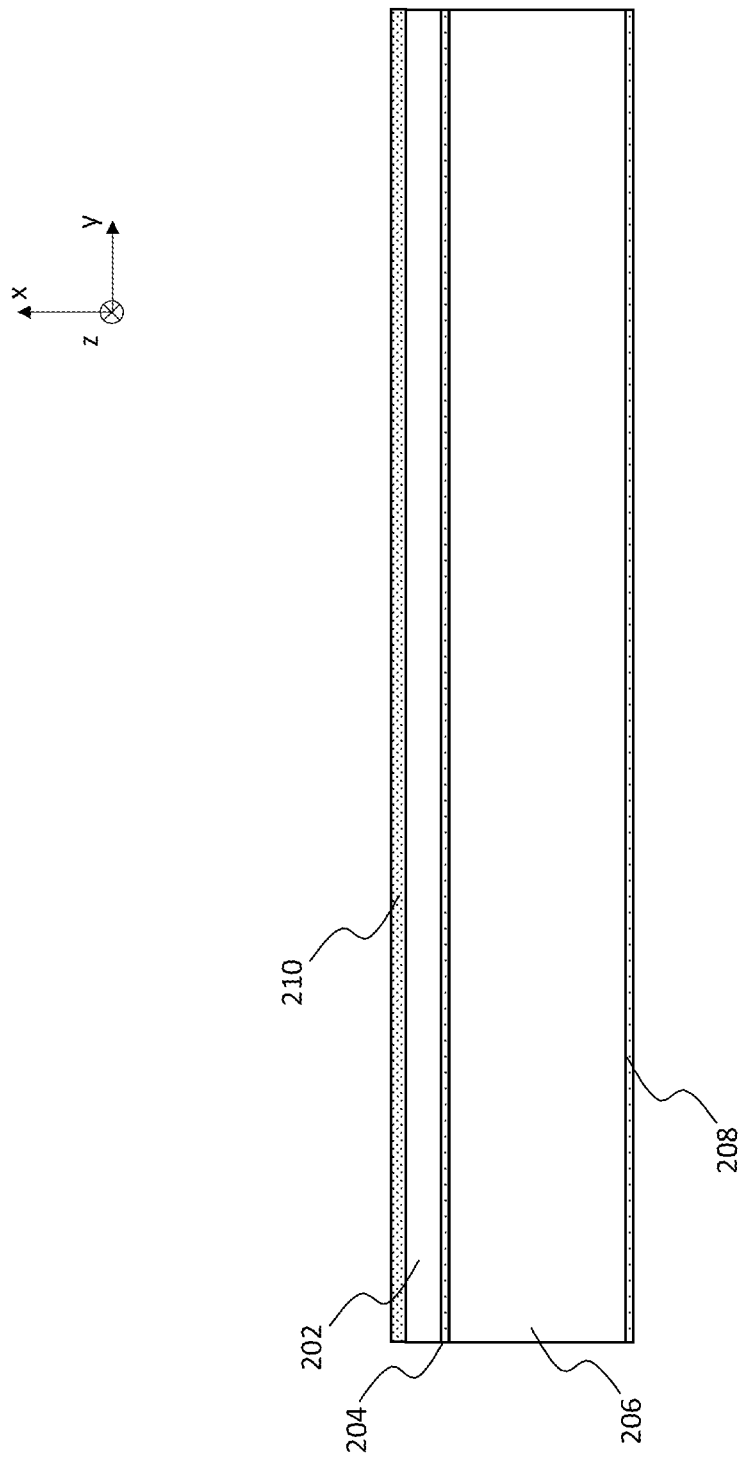

According to an embodiment of the present disclosure illustrated in FIG. 2B, the next phase of the manufacturing process comprises the deposition of an oxide layer 210 on the exposed surface of the device layer 202, for example by means of a Low pressure Chemical Vapor Deposition (LPCVD using tetraethyl orthosilicate as precursor) or by means of a thermal oxidation technique.

Figure 2C:
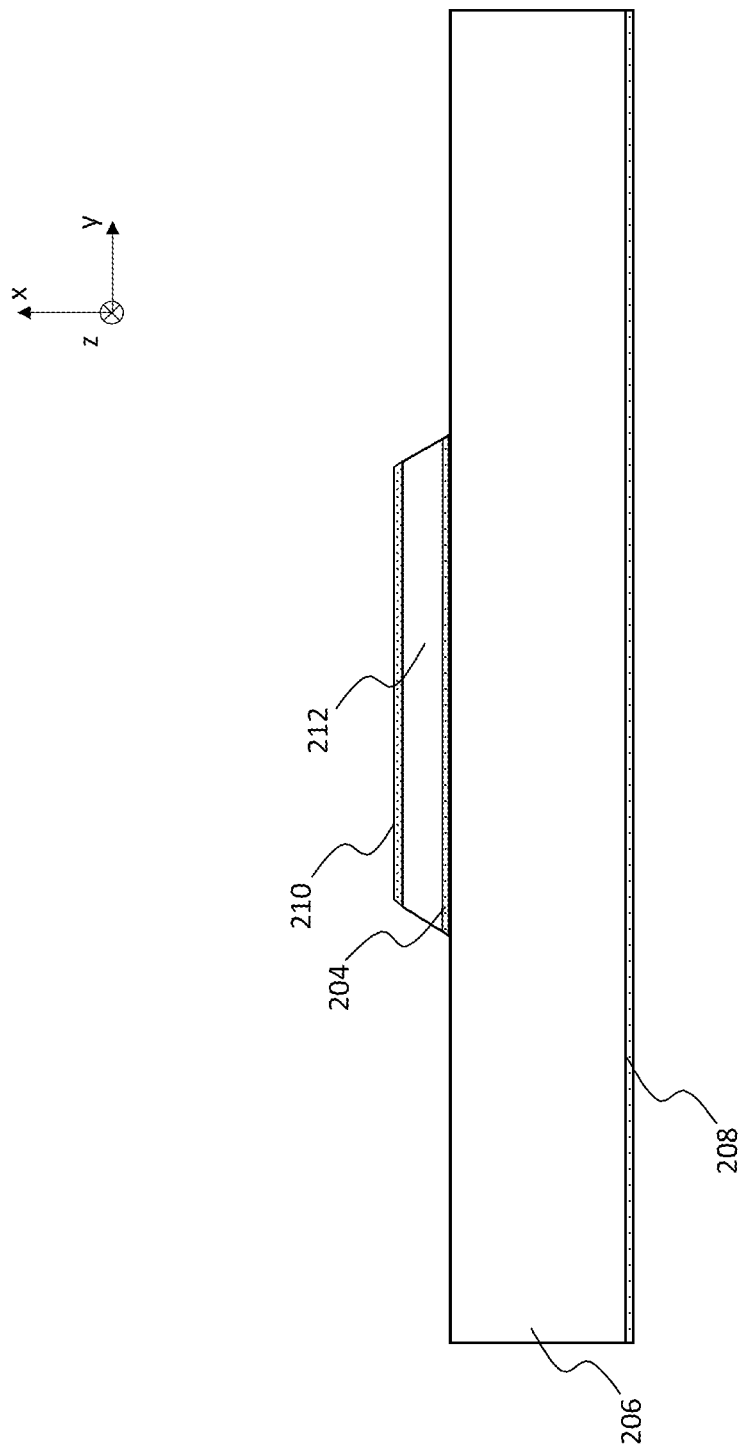

According to an embodiment of the present disclosure illustrated in FIG. 2C, the next phase of the manufacturing process comprises removing side portions of the oxide layer 210, the device layer 202, and the box layer 204 through wet or dry etching (based on the used oxide thickness) in such a way to leave a central portion 212 of the device layer 202 (between corresponding portions of the oxide layer 210 and the box layer 204), while laterally exposing portions of the underlying handle layer 206.

As will be better understood in the following, said central portion 212 of the device layer 202 that has not been removed will form the membrane element 125 of the finished PMUT device 100 (see FIG. 1).

Figure 2D:
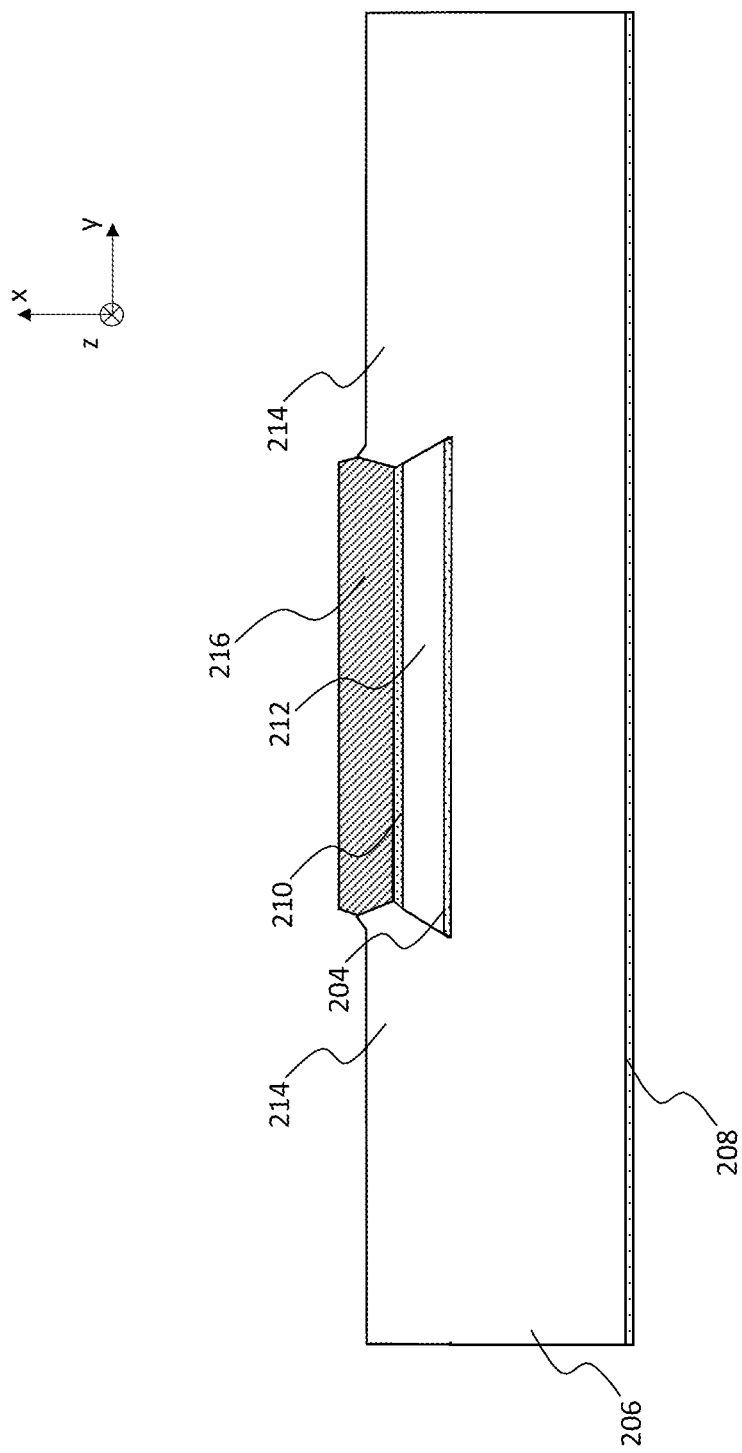

The following phase of the manufacturing process according to an embodiment of the present disclosure, which is illustrated in FIG. 2D, provides for growing silicon through an epitaxial growth process from the lateral exposed portions of the handle layer 206 and from the oxide layer 210 covering the central portion 212 of the device layer 202. In this way, monocrystalline silicon portions 214 are formed above the lateral exposed portions of the handle layer 206, and a polycrystalline layer 216 is formed above the oxide layer 210 covering the central portion 212 of the device layer 202.

As will be better understood in the following, part of the monocrystalline silicon portions 214 will form the anchor portions 135 that connect the membrane element 125 to the silicon substrate 110 of the finished PMUT device 100 (see FIG. 1).

According to an embodiment of the present disclosure illustrated in FIG. 2E, the next phase of the manufacturing process provides for carry out an etching and planarization procedure directed to entirely remove the polycrystalline layer 216 to expose the underlying oxide layer 210 and to remove upper portions of the monocrystalline silicon portions 214. For example, the planarization can be carried out using a Chemical Mechanical Polishing (CMP) technique.

Figure 2F:
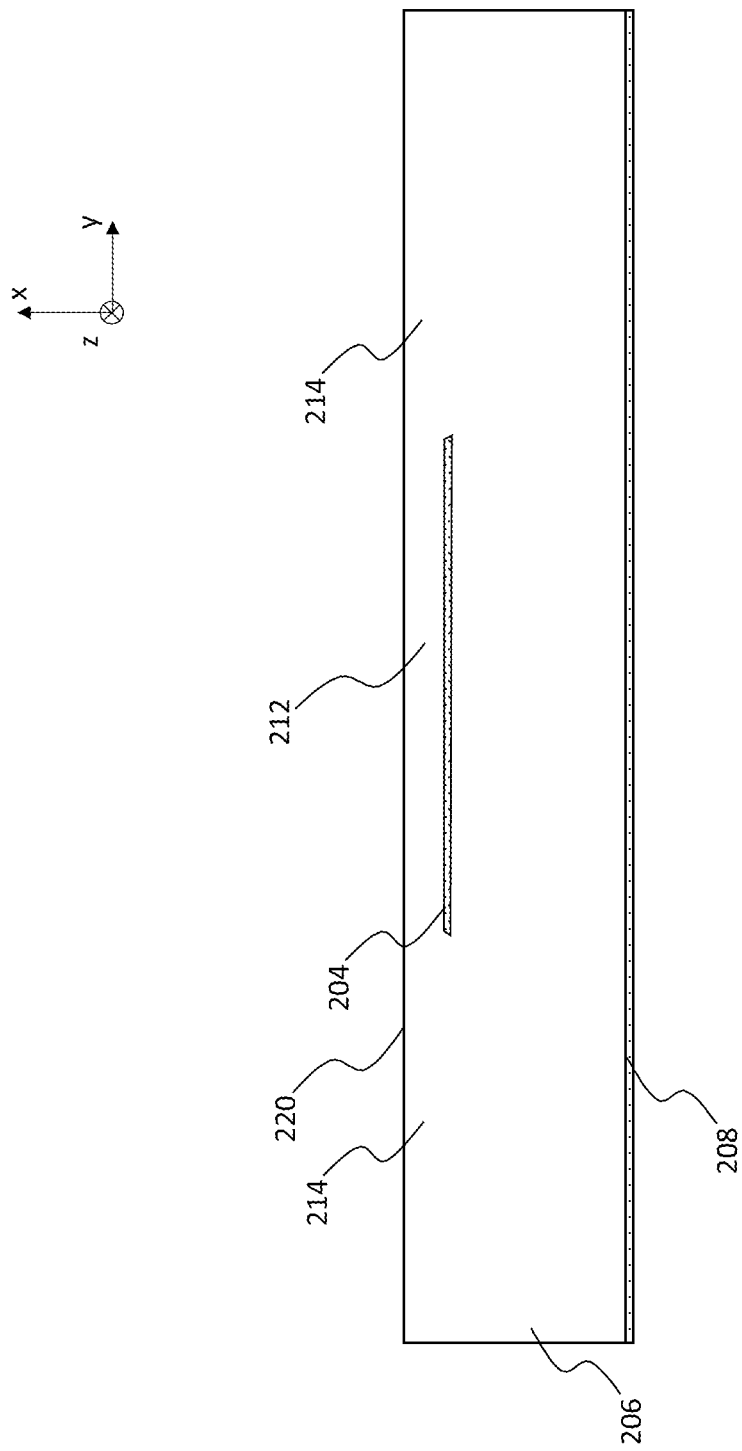

The following phase of the manufacturing process according to an embodiment of the present disclosure, which is illustrated in FIG. 2F, provides for removing the exposed oxide layer 210, for example by means of an etching procedure, in order to obtain a substantially flat top surface made of monocrystalline silicon, identified in figure with reference 220.

As will be better understood in the following, lateral parts of the surface 220 will correspond to the front operative surface 112 of the silicon substrate 110 of the finished PMUT device 100, while a central part of the surface 220 will correspond to the top surface 128 of the cantilevered membrane element 125 (see FIG. 1).

Figure 2G:
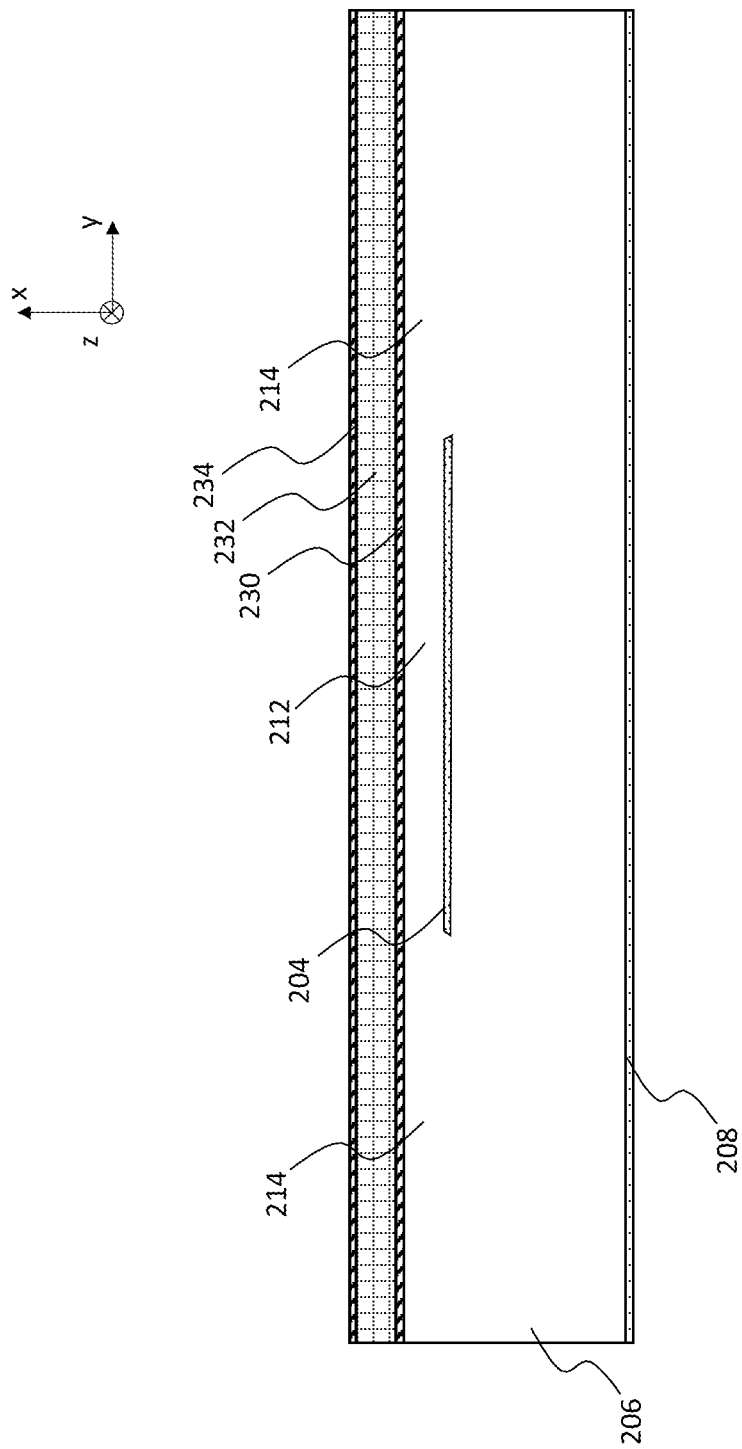

According to an embodiment of the present disclosure illustrated in FIG. 2G, the next phase of the manufacturing process provides for deposing on the surface 220 a first layer of conductive material 230, such as molybdenum, deposing on the first layer of conductive material 200 a layer of piezoelectric material 232, such as comprising aluminum nitride, and then deposing on the layer of piezoelectric material 232 a second layer of conductive material 234, such as molybdenum.

Figure 2H:
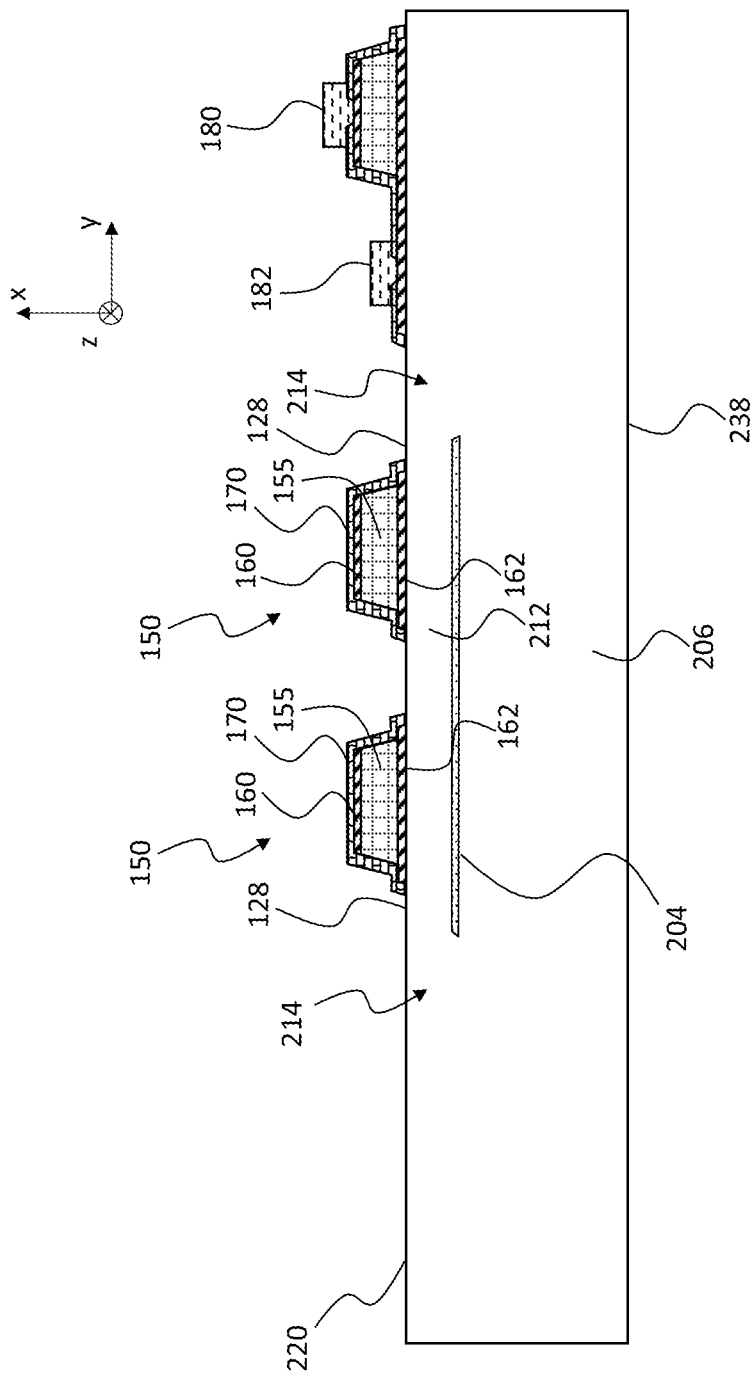

According to an embodiment of the present disclosure illustrated in FIG. 2H, the next phase of the manufacturing process provides for removing (e.g., through etching) patterned portions of the stack of the layers 230, 232, 234 until exposing areas of the underlying surface 220, so as to define the piezoelectric element 150 (see FIG. 1). As already described with reference to FIG. 1, the resulting piezoelectric element 150 comprises a layer of piezoelectric material 155—obtained from layer 232—between two layers made of conductive materials 161, 162—obtained from layers 230 and 234, respectively—forming the electrodes of the piezoelectric element 150.

According to an embodiment of the present disclosure, this phase further provides for covering the piezoelectric element 150 with a passivation layer 170, such as comprising aluminum nitride (see FIG. 1), and removing the back oxide layer 208, so as to expose a bottom surface 238 of the handle layer 206.

Without providing details not relevant for the understanding of the present disclosure, and well known to those skilled in the art, a contact element 180 is formed to electrically contact the first layer 160 of conductive material, and a contact element 182 is formed to electrically contact the second layer 162 of conductive material. According to an embodiment of the present disclosure, the contact elements 180, 182 are made of a highly conductive material, such as gold, aluminum or aluminum-copper.

Figure 2I:
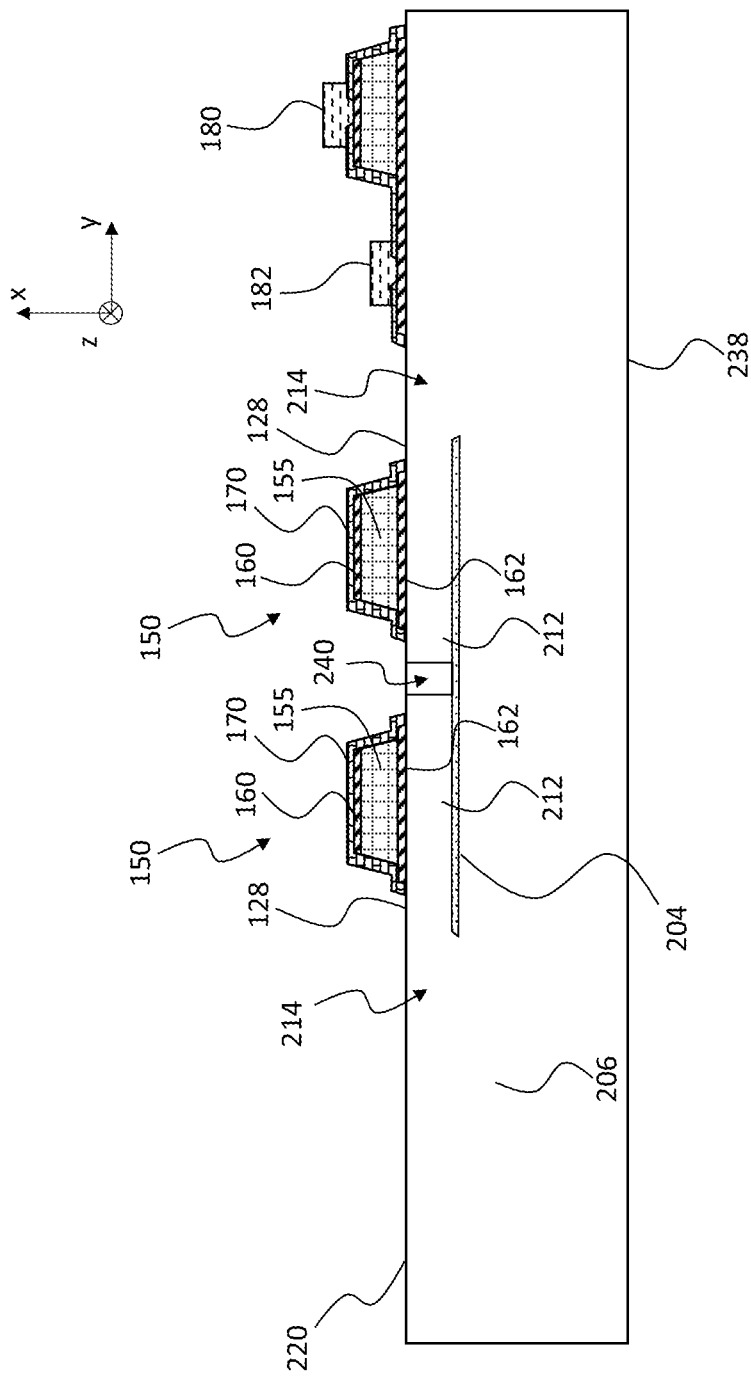

According to an embodiment of the present disclosure illustrated in FIG. 2I, the next phase of the manufacturing process provides for creating in the central portion 212 of the device layer 202 an opening 240 until exposing the underlying box layer 204. According to an embodiment of the present disclosure, the opening 240 is obtained by applying a trench mask and then by carrying out a silicon dry etching procedure.

As will be better understood in the following, the opening 240 will define the vent hole 140 provided in a central portion of the membrane element 125 of the finished PMUT device 100 (see FIG. 1).

Figure 2J:
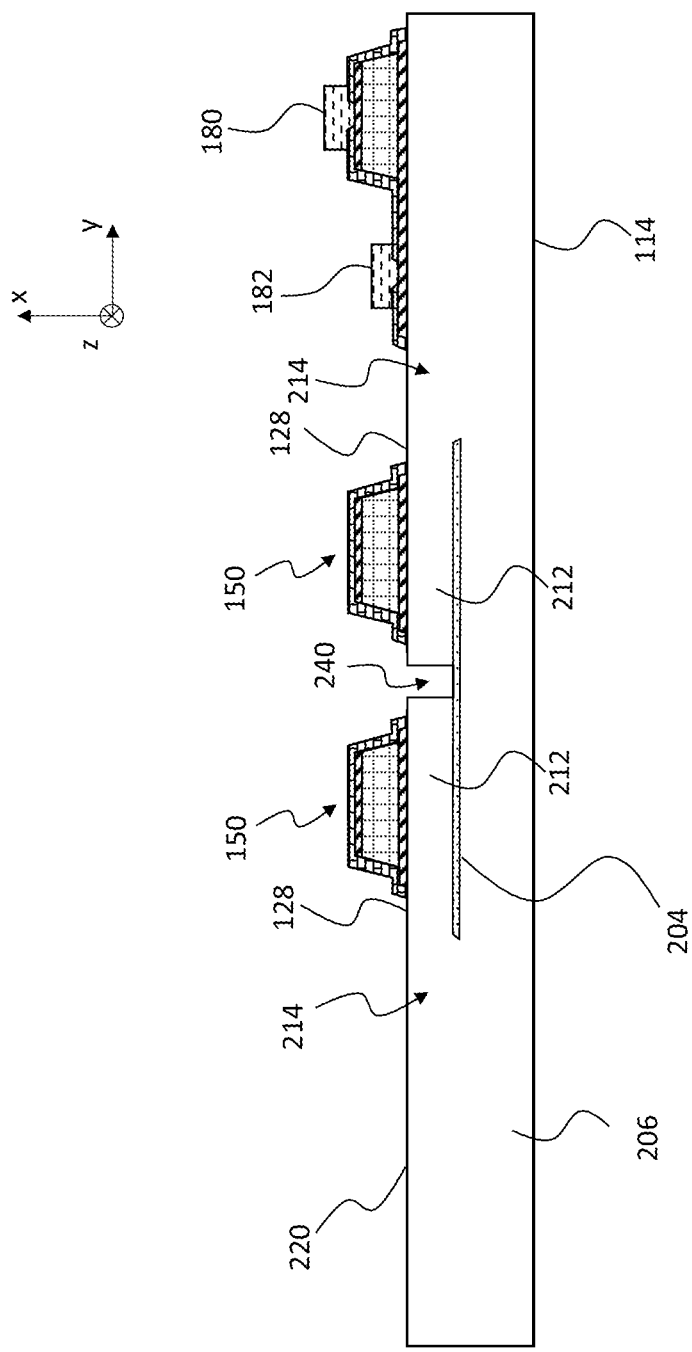

The following phase of the manufacturing process according to an embodiment of the present disclosure, which is illustrated in FIG. 2J, provides for carrying out a backside grinding operation directed to remove portions of the handle layer 206 from the bottom surface 238 to bring the thickness of the handle layer 206 itself along the direction X at a desired value, such as for example ranging from 300 to 400 µm, e.g., 350 µm. Once the handle layer 206 reached the desired thickness, the exposed bottom surface of the handle layer 206 corresponds to the back operative surface 114 of the semiconductor substrate 110 of the completed PMUT device 100 (see FIG. 1).

Figure 2K:
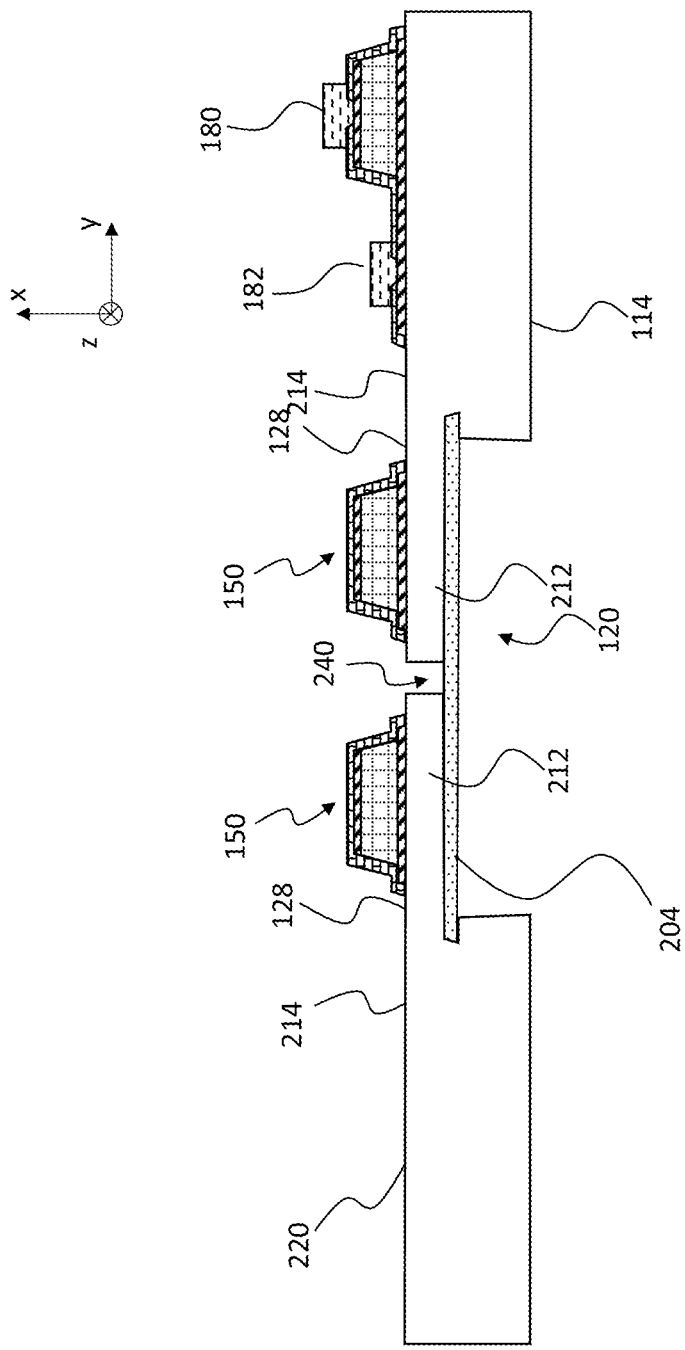

According to an embodiment of the present disclosure illustrated in FIG. 2K, the next phase of the manufacturing process provides for generating the recess 120 (see FIG. 1) from the back operative surface 114 along the direction X through a silicon dry etching procedure.

Once the remaining portion of the box layer 204 has been removed, for example with the application of hydrofluoric acid, the PMUT device 100 is obtained (see FIG. 1).

According to the embodiment of the disclosure illustrated in FIGS. 2A-2K, the membrane element 125 of the finished PMUT device 100 has been formed using a central portion 212 of the monocrystalline silicon device layer 202, which is connected to the silicon substrate 100 of the finished PMUT device 100 by anchor portions 135 obtained from monocrystalline silicon portions 214 epitaxially grown above lateral exposed portions of the handle layer 206.

The PMUT device 100 obtained with the manufacturing process illustrated in FIGS. 2A-2K has the following advantages.

Both the membrane element 125 and the anchor portions 135 are formed in the same material, i.e., monocrystalline silicon.

Since the anchor portions 135 have been formed through a homoepitaxial grown process, in which monocrystalline silicon of the anchor portions 135 is grown from monocrystalline silicon portions of the handle layer 206, the silicon substrate is not subjected to mechanical stresses, improving thus the mechanical and electrical properties of the PMUT device 100. Differently, known solutions provide for forming anchor portions by deposition of a Silicon dioxide layer followed by selective etching, or by deposition of polysilicon into trenches realized in the substrate, causing not negligible stress on the semiconductor substrate during the formation of the anchor portions (and therefore negatively influencing the reliability and efficiency of the device itself).

Moreover, since the manufacturing process illustrated in FIGS. 2A-2K started from a Silicon-On-Insulator substrate 200 having a device layer 202 with a thickness along the direction X that already correspond to the desired thickness of the membrane element 125, the thickness of the resulting membrane element 125 in the completed PMUT device 100 is very precise, and less subjected to process mismatches. As a consequence, the resonance frequency of the PMUT device 100 is more precise.

Other advantages of the present solution are that the proposed manufacturing process does not require a trimming at the end thereof, and does not require a double electric wafer sort (in line trimming on finished membrane and/or device passivation being still possible).

FIGS. 3A-3F illustrate some of the main steps of a method for manufacturing the PMUT device 100 of FIG. 1 according to a second embodiment of the present disclosure.

Making reference to FIG. 3A, the manufacturing process according to this embodiment of the present disclosure starts by providing as starting substrate a Silicon-On-Insulator substrate 300 comprising, proceeding along the direction X from top toward the bottom, a monocrystalline silicon device layer 302, a silicon dioxide box layer 304, a handle layer 306, and a silicon dioxide back oxide layer 308.

Unlike the previous embodiment of the disclosure (corresponding to FIGS. 2A-2K), according to this embodiment of the disclosure the thickness of the device layer 302 along the direction X is lower than the desired thickness of the membrane element 125 of the PMUT device 100 (see FIG. 1). For example, the thickness of the device layer 302 may be lower than 1.5 μm.

According to an exemplary embodiment of the present disclosure, the box layer 304 has a thickness along the direction X lower than the thickness of the device layer 302, such as for example lower than 0.5 μm.

According to an exemplary embodiment of the present disclosure, the thickness of the handle layer 306 along the direction X may range from 1000 to 400 μm, and in some embodiments, between 650 and 750 μm.

According to an embodiment of the present disclosure illustrated in FIG. 3B, the next phase of the manufacturing process comprises the growth of an oxide layer 310 on the exposed surface of the device layer 302, for example by means of an oxidation process or Low pressure chemical vapor deposition According to an embodiment of the present disclosure illustrated in FIG. 3C, the next phase of the manufacturing process comprises removing side portions of the oxide layer 310, the device layer 302, and the box layer 304 through wet or dry etching in such a way to leave a central portion 312 of the device layer 302 (between corresponding portions of the oxide layer 310 and the box layer 304), while laterally exposing portions of the underlying handle layer 306.

Unlike the previous embodiment of the disclosure (corresponding to FIGS. 2A-2K), the central portion 312 of the device layer 302 that has not been removed cannot be directly used to form the membrane element 125 of the completed PMUT device 100 (see FIG. 1), because it has a thickness that is different (i.e., lower) than the desired thickness of the membrane element 125.

Figure 3D:
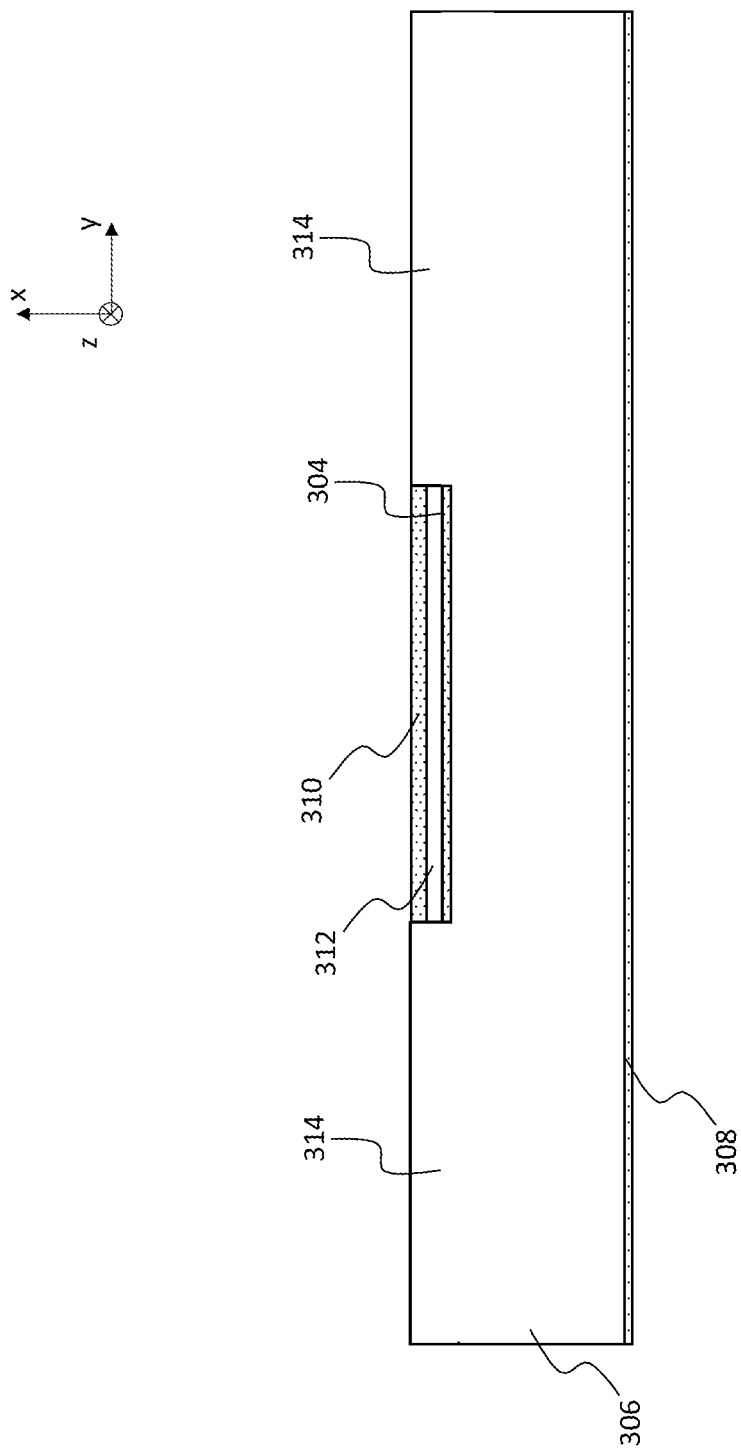

The next phase of the manufacturing process according to an embodiment of the present disclosure, which is illustrated in FIG. 3D, provides for growing silicon through a selective epitaxial growth process from the lateral exposed portions of the handle layer 306. According to an embodiment of the present disclosure, the selective epitaxial growth process is configured in such a way to grow silicon only from the lateral exposed portions of the handle layer 306, preventing any silicon growth over the oxide layer 310. For example, the selective epitaxial growth process can exploit silane or diclorosilane as silicon precursor and hydrochloric acid as selective agent (according with known methods reported in literature). In this way, monocrystalline silicon portions 314 are formed only above the lateral exposed portions of the handle layer 306.

According to an embodiment of the present disclosure, the selective epitaxial growth process is continued until the grown monocrystalline silicon portions 314 are substantially flush with the oxide layer 310.

Since a small portion of the oxide layer 310 is unavoidably removed during the selective epitaxial growth process depending on the process temperature and partial pressure of the gases the oxide layer 310 should be generated with a sufficiently large thickness to avoid that it is entirely removed during this phase. For example, for a selective epitaxial growth process using a temperature range of 800-1100° C., the thickness of the oxide layer 310 should in some embodiments be set in the range of 0.1-1 μm.

Figure 3E:
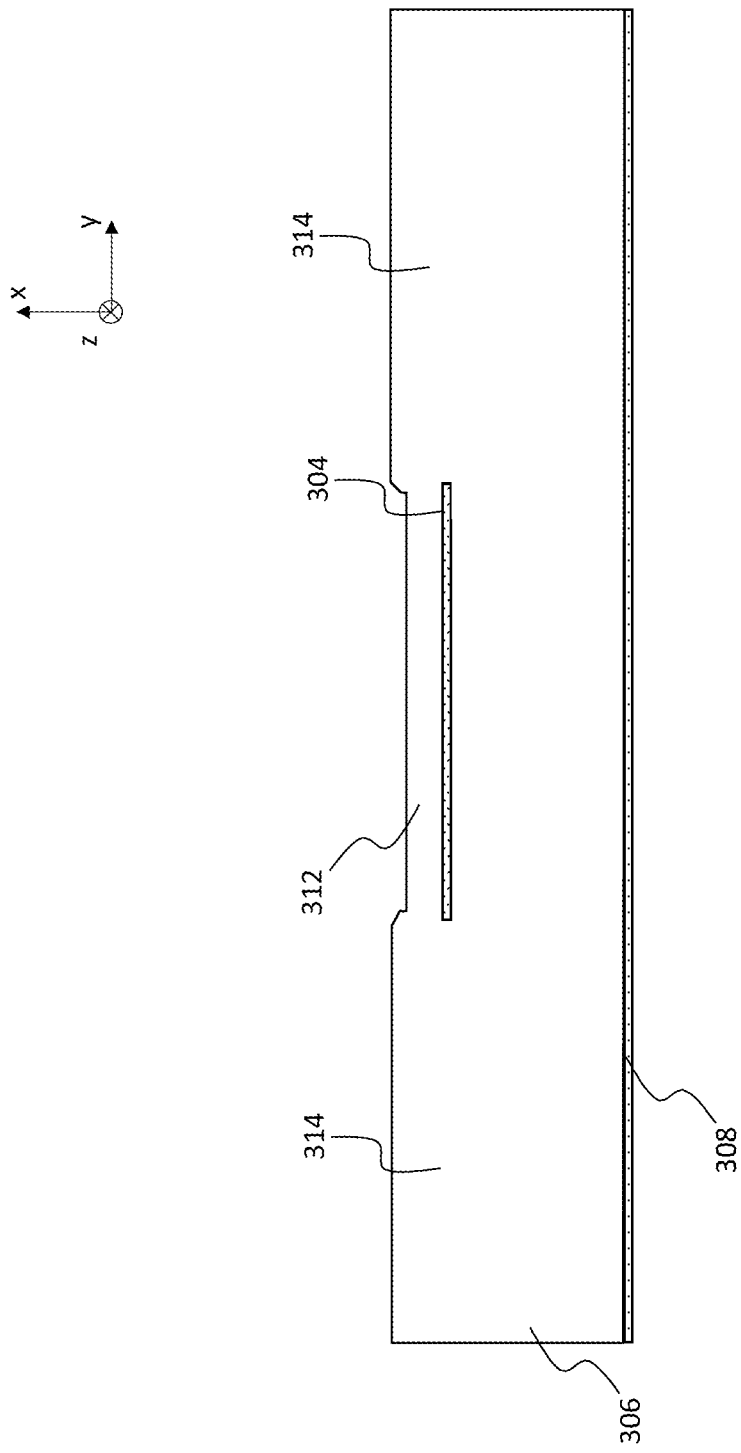

According to an embodiment of the present disclosure illustrated in FIG. 3E, the next phase of the manufacturing process comprises removing the oxide layer 310 to expose the central portion 312 of the device layer 302, and then growing monocrystalline silicon through an epitaxial growth process over the monocrystalline silicon portions 314 and the now exposed monocrystalline central portion 312. The epitaxial growth process is carried out until the thickness (along direction X) of the monocrystalline central portion 312 reaches the desired thickness of the membrane element 125 of the completed PMUT device 100 (see FIG. 1).

Figure 3F:
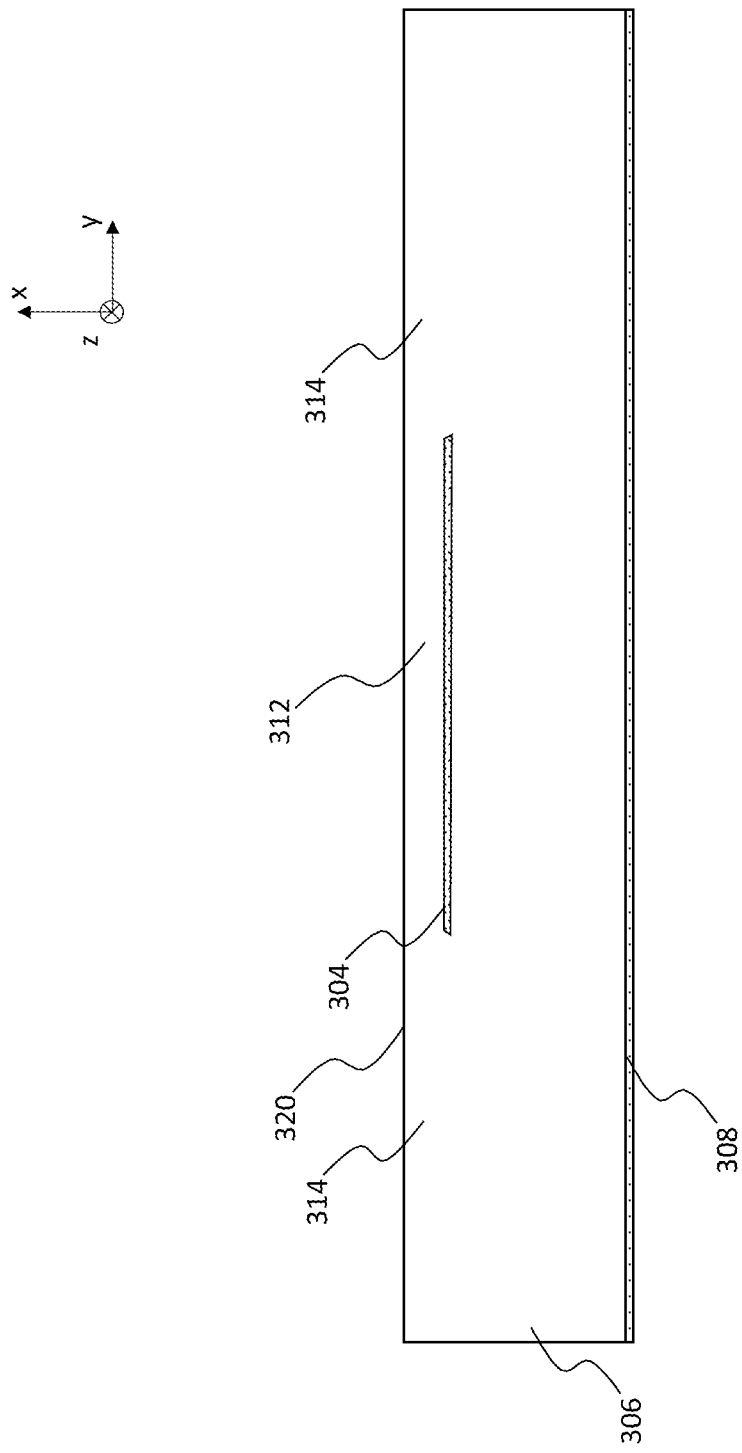

According to an embodiment of the present disclosure illustrated in FIG. 3F, the next phase of the manufacturing process provides for carry out a smoothing procedure directed to obtain a substantially flat top surface made of monocrystalline silicon—identified in figure with reference 320—from the grown monocrystalline silicon. According to an exemplary embodiment of the disclosure, said smoothing procedure is carried out using a Chemical Mechanical Polishing (CMP) technique and/or a high temperature hydrogen annealing technique.

According to an embodiment of the present disclosure, the (thickened) monocrystalline central portion 312 will form the membrane element 125 of the finished PMUT device 100 (see FIG. 1).

According to an embodiment of the present disclosure, part of the (thickened) monocrystalline silicon portions 314 will form the anchor portions 135 that connect the membrane element 125 to the silicon substrate 110 of the finished PMUT device 100 (see FIG. 1).

According to an embodiment of the present disclosure, lateral parts of the surface 320 will correspond to the front operative surface 112 of the silicon substrate 110 of the finished PMUT device 100, while a central part of the surface 320 will correspond to the top surface 128 of the cantilevered membrane element 125 (see FIG. 1).

From now on, the manufacturing process will proceed in the same way as in the embodiment of the disclosure illustrated in FIGS. 2A-2K, and therefore no details will be provided for the sake of conciseness.

Briefly, the piezoelectric element 150 and the contact elements 180, 182 are formed. Then, an opening for the definition of the vent hole 140 is opened, and a backside grinding operation is carried out for removing portions of the handle layer 306. At this point, the recess 120 is generated, the remaining portion of the box layer 304 is removed, and the PMUT device 100 is obtained (see FIG. 1).

According to the embodiment of the disclosure illustrated in FIGS. 3A-3F, the membrane element 125 of the finished PMUT device 100 has been formed epitaxially growing monocrystalline silicon over a central portion 312 of the monocrystalline silicon device layer 302, with the membrane element that is connected to the silicon substrate 100 of the finished PMUT device 100 by anchor portions 135 obtained from monocrystalline silicon portions 314 epitaxially grown above lateral exposed portions of the handle layer 306.

The PMUT device 100 obtained with the manufacturing process illustrated in FIGS. 3A-3F has the following advantages.

Both the membrane element 125 and the anchor portions 135 are formed in the same material, i.e., monocrystalline silicon.

Since the anchor portions 135 have been formed through a homoepitaxial grown process, in which monocrystalline silicon of the anchor portions 135 is grown from monocrystalline silicon portions of the handle layer 306, the silicon substrate is not subjected to mechanical stresses, improving thus the mechanical and electrical properties of the PMUT device 100.

Moreover, the manufacturing process illustrated in FIGS. 3A-3F started from a Silicon-On-Insulator substrate 300 having a device layer 302 with a thickness along the direction X lower than desired thickness of the membrane element 125, and the thickness of the resulting membrane element 125 in the completed PMUT device 100 is reached through epitaxial growth. Therefore, possible spreads due to process mismatches are strongly reduced, because relating only to the (relatively small) epitaxially grown portion of the membrane element. As a consequence, in this case as well, the resonance frequency of the PMUT device 100 is more precise.

Figure 4:
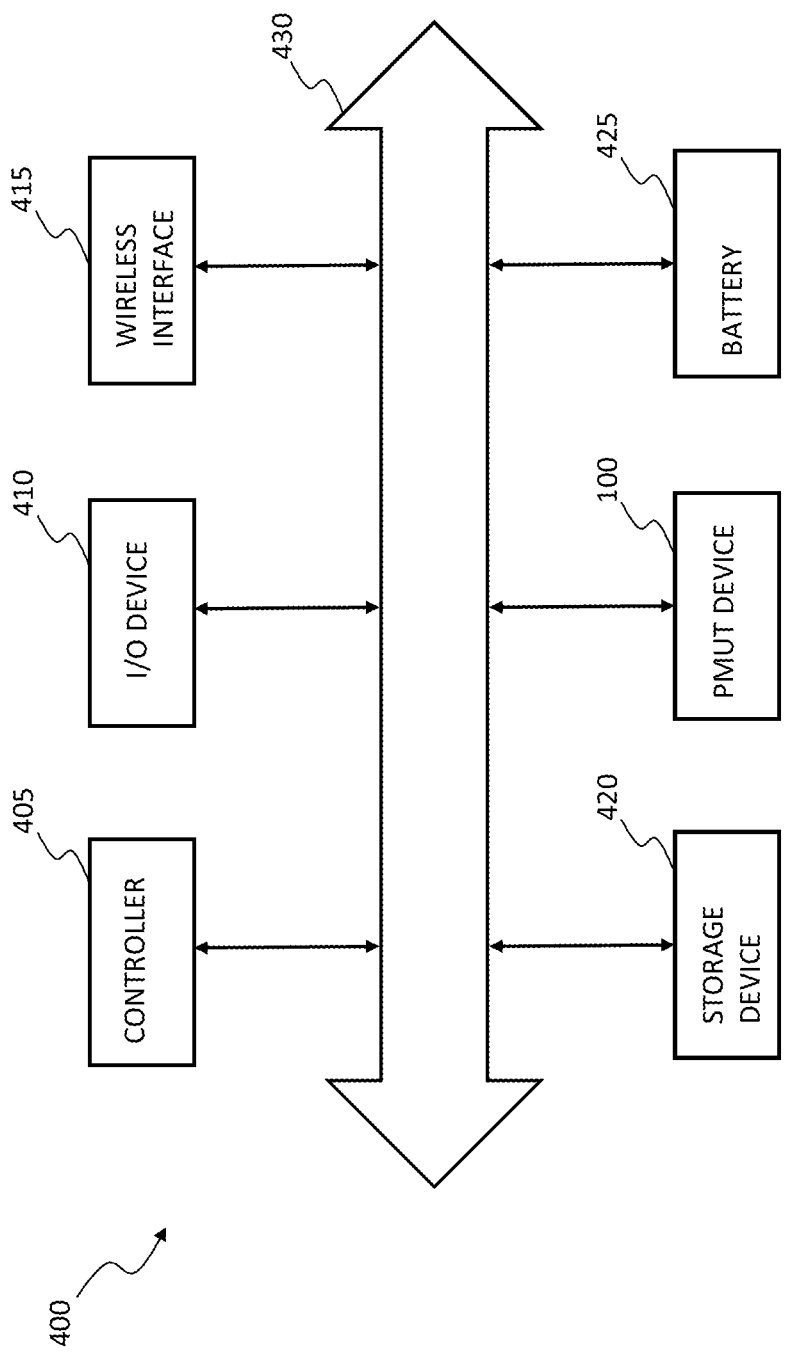
FIG. 4 illustrates in terms of simplified blocks an electronic system comprising at least one PMUT device of FIG. 1.

FIG. 4 illustrates in terms of simplified blocks an electronic system 400 (or a portion thereof) comprising at least one PMUT device 100 manufactured according to the embodiments of the disclosure described above.

According to an embodiment of the present disclosure, the electronic system 400 is adapted to be used in electronic devices such as for example personal digital assistants, computers, tablets, and smartphones.

According to an embodiment of the present disclosure, the electronic system 400 may comprise, in addition to the PMUT device 100, a controller 405, such as for example one or more microprocessors and/or one or more microcontrollers.

According to an embodiment of the present disclosure, the electronic system 400 may comprise, in addition to the PMUT device 100, an input/output device 410 (such as for example a keyboard, and/or a touch screen and/or a visual display) for generating/receiving messages/commands/data, and/or for receiving/sending digital and/or analogic signals.

According to an embodiment of the present disclosure, the electronic system 400 may comprise, in addition to the PMUT device 100, a wireless interface 415 for exchanging messages with a wireless communication network (not shown), for example through radiofrequency signals. Examples of wireless interface 415 may comprise antennas and wireless transceivers.

According to an embodiment of the present disclosure, the electronic system 400 may comprise, in addition to the PMUT device 100, a storage device 420, such as for example a volatile and/or a non-volatile memory device.

According to an embodiment of the present disclosure, the electronic system 400 may comprise, in addition to the PMUT device 100, a supply device, for example a battery 425, for supplying electric power to the electronic system 400.

According to an embodiment of the present disclosure, the electronic system 400 may comprise one or more communication channels (buses) for allowing data exchange between the PMUT device 100 and the controller 405, and/or the input/output device 410, and/or the wireless interface 415, and/or the storage device 420, and/or the battery 425, when they are present.

Naturally, in order to satisfy local and specific requirements, a person skilled in the art may apply to the solution described above many logical and/or physical modifications and alterations. More specifically, although the present disclosure has been described with a certain degree of particularity with reference to preferred embodiments thereof, it should be understood that various omissions, substitutions and changes in the form and details as well as other embodiments are possible. In particular, different embodiments of the disclosure may even be practiced without the specific details set forth in the preceding description for providing a more thorough understanding thereof; on the contrary, well-known features may have been omitted or simplified in order not to encumber the description with unnecessary details. Moreover, it is expressly intended that specific elements and/or method steps described in connection with any disclosed embodiment of the disclosure may be incorporated in other embodiments.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A Piezoelectric Micromachined Ultrasonic Transducer (PMUT) device, comprising:
   a silicon substrate including a first surface and a second surface opposite to the first surface;
   a membrane element configured to, in operation, generate and receive ultrasonic waves by oscillating about an equilibrium position at a resonance frequency, the membrane element having a first thickness;
   anchor portions fixing the membrane element to the silicon substrate, the anchor portions being directly and physically coupled to a majority of the first surface of the silicon substrate, the anchor portions having a second thickness greater than the first thickness;
   one or more notches delimited by the membrane element, the anchor portions, and the first surface of the silicon substrate; and
   a piezoelectric element on the membrane element, the piezoelectric element configured to, in operation:
      cause the membrane element to oscillate when electric signals are applied to the piezoelectric element; and
      generate electric signals in response to oscillations of the membrane element, and wherein the membrane element and the anchor portions are made of monocrystalline silicon, and no other material is directly or physically coupled to the first surface of the silicon substrate other than the anchor portions.

2. The PMUT device of claim 1, wherein the anchor portions are formed of epitaxially grown monocrystalline silicon.

3. The PMUT device of claim 1, wherein the membrane element made of the monocrystalline silicon is continuously formed along with the anchor portions made of the monocrystalline silicon.

4. The PMUT device of claim 1, wherein the anchor portions extend directly between the silicon substrate and the membrane element.

5. The PMUT device of claim 1, wherein the membrane element has a thickness within a range from 1 µm to 2.5 µm.

6. An electronic system, comprising:
one or more Piezoelectric Micromachined Ultrasonic Transducer (PMUT) devices, each of the one or more PMUT devices including:
a silicon substrate including a first surface and a second surface opposite to the first surface, one or more lateral walls that extend into the second surface of the silicon substrate;
a membrane element configured to, in operation, generate and receive ultrasonic waves by oscillating about an equilibrium position at a resonance frequency, the membrane element having a first thickness;
anchor portions fixing the membrane element to the silicon substrate, the anchor portions being directly and physically coupled to a majority of the first surface of the silicon substrate, the anchor portions having a second thickness greater than the first thickness;
one or more notches delimited by the membrane element, the anchor portions, and the first surface of the silicon substrate; and
a piezoelectric element on the membrane element, the piezoelectric element is spaced inward the piezoelectric element configured to:
cause the membrane element to oscillate when electric signals are applied to the piezoelectric element; and
generate electric signals in response to oscillations of the membrane element, and
wherein the membrane element and the anchor portions are made of monocrystalline silicon, and no other material is directly or physically coupled to the first surface of the silicon substrate other than the anchor portions.

7. The system of claim 6, wherein the anchor portions are formed of epitaxially grown monocrystalline silicon.

8. The system of claim 6, further comprising:
a controller communicatively coupled to the one or more PMUT devices;
a memory device communicatively coupled to the one or more PMUT devices; and
a power supply electrically coupled to at least one of the controller, the memory device, or the one or more PMUT devices.

9. The system of claim 6, wherein the membrane element has a surface that is flush with a front surface of the silicon substrate.

10. A device, comprising:
one or more external lateral walls;
a monocrystalline silicon substrate including a first surface and a second surface opposite to the first surface, one or more internal lateral walls that are spaced inward from the one or more external lateral walls and that extend into the second surface of the monocrystalline silicon substrate;
a monocrystalline silicon membrane element coupled to the monocrystalline silicon substrate, the monocrystalline silicon membrane element including a third surface and a fourth surface opposite to the third surface;
at least one monocrystalline anchor portion that couples the monocrystalline silicon membrane element to the monocrystalline silicon substrate, the at least one monocrystalline anchor portion directly coupled to and formed on the first surface of the monocrystalline silicon membrane element, the at least one monocrystalline anchor portion is made of a continuous material along with the monocrystalline silicon membrane element, and the at least one monocrystalline anchor portion includes one or more notch sidewalls, the one or more notch sidewalls being directly on the second surface;
a vent hole extending through the monocrystalline silicon membrane element from the third surface to the fourth surface; and
a cavity extending into the first surface of the monocrystalline silicon substrate to the third surface of the monocrystalline silicon membrane element, the cavity including:
a first portion delimited by the one or more internal lateral walls of the monocrystalline silicon substrate; and
a second portion wider than the first portion, the second portion includes one or more notches spaced outward from the one or more internal lateral walls of the monocrystalline silicon substrate and delimited by the one or more notch sidewalls, and the second portion is delimited by the one or more notch sidewalls, the second surface, and the third surface, and
wherein the first surface is devoid of any other material other than the at least one monocrystalline anchor portion.

11. The device of claim 10, wherein the monocrystalline silicon membrane element has a thickness within a range from 1 µm to 2.5 µm.

12. The device of claim 10, wherein the monocrystalline silicon membrane element has a thickness within a range of 1.5 µm to 2 µm.

13. The device of claim 10, wherein the monocrystalline silicon membrane element is configured to, in operation, generate and receive ultrasonic waves by oscillating at a resonance frequency about an equilibrium position.

14. The device of claim 10, wherein the second surface of the monocrystalline silicon substrate is coplanar with the fourth surface of the monocrystalline silicon membrane element.

15. The device of claim 10, further comprising a piezoelectric element on the fourth surface of the monocrystalline silicon membrane element, wherein the piezoelectric element is spaced inward from the one or more internal lateral walls.

16. The device of claim 15, further comprising:
a first contact element on the second surface of the monocrystalline silicon substrate; and a second contact element on the second surface of the monocrystalline silicon substrate.

17. The device of claim 16, further comprising:

a first conductive layer coupled to the first contact element; and a second conductive layer coupled to the second contact element.

18. The device of claim 17, wherein the piezoelectric element includes:

a first electrode of the first conductive layer; and a second electrode of the second conductive layer.

19. The device of claim 18, wherein:

the first electrode is in electrical communication with the first contact element through the first conductive layer; and the second electrode is in electrical communication with the second contact element through the second conductive layer.

20. The device of claim 18, wherein the piezoelectric element includes a piezoelectric material between the first conductive layer and the second conductive layer.

* * * * *